US008976905B1

(12) United States Patent
Zhou et al.

(10) Patent No.: US 8,976,905 B1
(45) Date of Patent: *Mar. 10, 2015

(54) ROBUST DIFFERENTIAL RECEIVER FOR FREQUENCY MODULATED SYSTEM

(71) Applicant: Marvell International Ltd., Hamilton (BM)

(72) Inventors: Quan Zhou, Sunnyvale, CA (US); Songping Wu, Cupertino, CA (US); Hui-Ling Lou, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/169,317

(22) Filed: Jan. 31, 2014

Related U.S. Application Data

(63) Continuation of application No. 12/498,755, filed on Jul. 7, 2009, now Pat. No. 8,644,426.

(60) Provisional application No. 61/080,496, filed on Jul. 14, 2008.

(51) Int. Cl.
*H04L 27/22* (2006.01)
*H04B 1/10* (2006.01)

(52) U.S. Cl.
CPC .................................. *H04B 1/1027* (2013.01)
USPC ........................................................ 375/332

(58) Field of Classification Search
CPC ..... H04L 27/22; H04L 27/0014; H04L 7/041; H04L 27/2332; H04L 27/2662; H04L 27/261; H04L 7/046; H04L 2027/0055; H04L 25/08; H03D 3/22; H04B 1/10; H04B 1/1027

USPC ......... 375/226, 260, 279, 303, 308, 319, 321, 375/324, 326, 329, 332

See application file for complete search history.

(56) References Cited

U.S. PATENT DOCUMENTS

| | | | |
|---|---|---|---|
| 2002/0122509 A1 | 9/2002 | Mueller et al. | |
| 2002/0168034 A1 | 11/2002 | Yang et al. | |
| 2004/0125862 A1* | 7/2004 | Li et al. | ........................ 375/147 |
| 2004/0125901 A1* | 7/2004 | Nakahara et al. | ............. 375/368 |
| 2005/0136856 A1 | 6/2005 | Goldberg | |
| 2007/0155329 A1 | 7/2007 | Mehrabanzad et al. | |
| 2008/0056305 A1 | 3/2008 | Medvedev et al. | |
| 2008/0240295 A1 | 10/2008 | Kim | |
| 2008/0293370 A1 | 11/2008 | Wood | |

\* cited by examiner

*Primary Examiner* — Syed Haider

(57) ABSTRACT

A robust differential receiver is described that may be used in any frequency modulated system, including short-range radio frequency (RF) communication devices. The differential receiver provides a preamble detection approach that reduces false preamble detection, a fine carrier frequency (CFO) estimation approach that provides an extended estimation range, and robust in-band and out-of-band interference detection. The described differential receiver assures that preamble detections are not falsely triggered, and that CFO estimates are based on accurately modeled preamble waveforms that have not been distorted by phase ambiguities or in-band distortion. In this manner, the described robust differential receiver assures that CFO estimates used to compensate remaining portions of detected signals are accurate, thereby reducing the likelihood that remaining portions of the detected signal will be affected by phase ambiguity distortions, thereby enhancing the differential receiver's ability to lock onto an otherwise unavailable communication channel, and/or reducing transmission errors and/or packet loss.

20 Claims, 10 Drawing Sheets

ROBUST DIFFERENTIAL RECEIVER FOR FREQUENCY MODULATED SYSTEM

INCORPORATION BY REFERENCE

This application is a continuation application of U.S. patent application Ser. No. 12/498,755 filed on Jul. 7, 2009, which claims the benefit of U.S. Provisional Application No. 61/080,496, filed on Jul. 14, 2008. The disclosure of prior applications is hereby incorporated by reference herein in their entireties.

BACKGROUND

Increasing demands for wireless ad-hoc interconnectivity between electronic devices has led to the development of a large number of wireless short-range communication protocols, such as Bluetooth and ultra low power (ULP) Bluetooth. Such protocols may be used to wirelessly exchange data over short distances, e.g., 0 to 100 meters, between fixed and/or mobile devices and may be used, for example, to replace wire-based protocols between two devices, to provide wireless connectivity to network access points, and to establish a wireless personal area network (PAN) between electronic devices within a limited physical distance of one another.

Such short-range communication protocols may be used to exchange information between a wide range of devices. For example, such short-range communication protocols may also be used by electronic devices, such as cell phones, hand-held radios, head-phones, personal recording devices and video game consoles, to facilitate short range information exchanges. In addition, such short-range communication protocols may be used by computing devices, such as laptop computers, hand-held computers, etc., to exchange information with peripheral equipment and accessories, such as printers, keyboards, wireless pointing devices, scanners, cameras and GPS receivers, and/or to exchange information with other computing devices either directly or via network access point.

SUMMARY

A robust differential receiver is described that may be used in any frequency modulated system, including short-range radio frequency (RF) communication devices. The differential receiver provides a preamble detection approach that reduces false preamble detection, a carrier frequency offset (CFO) estimation approach that provides an extended estimation range, and robust in-band and out-of-band interference detection.

In existing differential receivers, phase ambiguity, i.e., incorrect estimates of a received signal's phase, may occur in the presence of large frequency offset. For example, phase detectors within existing differential receivers may have a phase range from $-\pi$ to $\pi$. However, large frequency offsets in a received signal during the channel acquisition process may cause the phase accumulation to exceed $\pm\pi$, resulting in a distorted waveform and an inaccurate estimate of the CFO used to process remaining portions of the signal. Further, in-band and out-of band interference during the channel acquisition process may falsely trigger preamble detection, which may also result in inaccurate estimates of the CFO used to process remaining portions of the signal. Incorrect CFO estimates may prevent a frequency modulated device from being able to lock onto and/or maintain a communication connection via an otherwise useful communication channel, and/or may result in transmission errors and/or packet loss.

The described robust differential receiver may correct such deficiencies by detecting and repairing phase distortions in the received signal during the channel preamble detection process, thereby reducing the likelihood of a falsely triggered preamble detection and thereby allowing an accurate estimate of the CFO of the received signal. Further, the described robust differential receiver may generate a CFO estimate for a detected signal based on an average of the peak values identified within the corrected preamble or, alternatively, based on an average of all values between the first and last peaks of the corrected preamble.

In addition, the described robust differential receiver may include interference detection techniques that may be used to identify the presence of in-band and out-of-band interference in a received signal during the preamble detection process. The use of such interference detection techniques further reduces the likelihood of a falsely triggered preamble detection, and prevents a CFO estimate from being generated based on a detected preamble that includes distorted signal values that would lead to errors in the generated CFO estimate and, therefore, adversely affect subsequent processing of remaining portions of the signal.

Using the above techniques, the described robust differential receiver is able to assure that preamble detection is not falsely triggered, and that CFO estimates are based on accurately modeled preamble waveforms that have not been distorted by phase ambiguities or in-band distortion. Using such techniques, the described robust differential receiver assures that the CFO estimate used to compensate remaining portions of a detected signal is accurate such that the detected signal is centered at desired receiving channel, thereby reducing the likelihood that remaining portions of the detected signal will be affected by phase ambiguity distortions, enhancing the differential receiver's ability to lock onto an otherwise unavailable communication channel, and/or reducing transmission errors and/or packet loss.

One example embodiment of the described robust differential receiver may include, a phase detector that may generate phase values based on a stream of baseband data, and a preamble detection module that may include, a phase monitoring unit that may monitor the generated phase values and may detect an ambiguity in the phase values, a phase ambiguity elimination module that may remove the detected ambiguity to produce corrected phase values, and a preamble detection unit that may detect a communication channel preamble sequence based on the corrected phase values.

Another example embodiment of a method of implementing a robust differential receiver may include, generating phase values based on a stream of baseband data, detecting an ambiguity in the generated phase values, correcting the detected ambiguity thereby producing corrected phase values and detecting a communication channel preamble sequence based on the corrected phase values.

Yet another example embodiment of an RF device with a robust differential receiver may include, a phase detector that may generate phase values based on a stream of baseband data, and a preamble detection module that may include, a phase monitoring unit that may monitor the generated phase values and may detect an ambiguity in the phase values, a phase ambiguity elimination module that may remove the detected ambiguity to produce corrected phase values, and a preamble detection unit that may detect a communication channel preamble sequence based on the corrected phase values.

BRIEF DESCRIPTION OF THE DRAWINGS

Example embodiments of a robust differential receiver for a frequency modulated system will be described with reference to the following drawings, wherein like numerals designate like elements, and wherein.

DETAILED DESCRIPTION OF EMBODIMENTS

Figure 1:
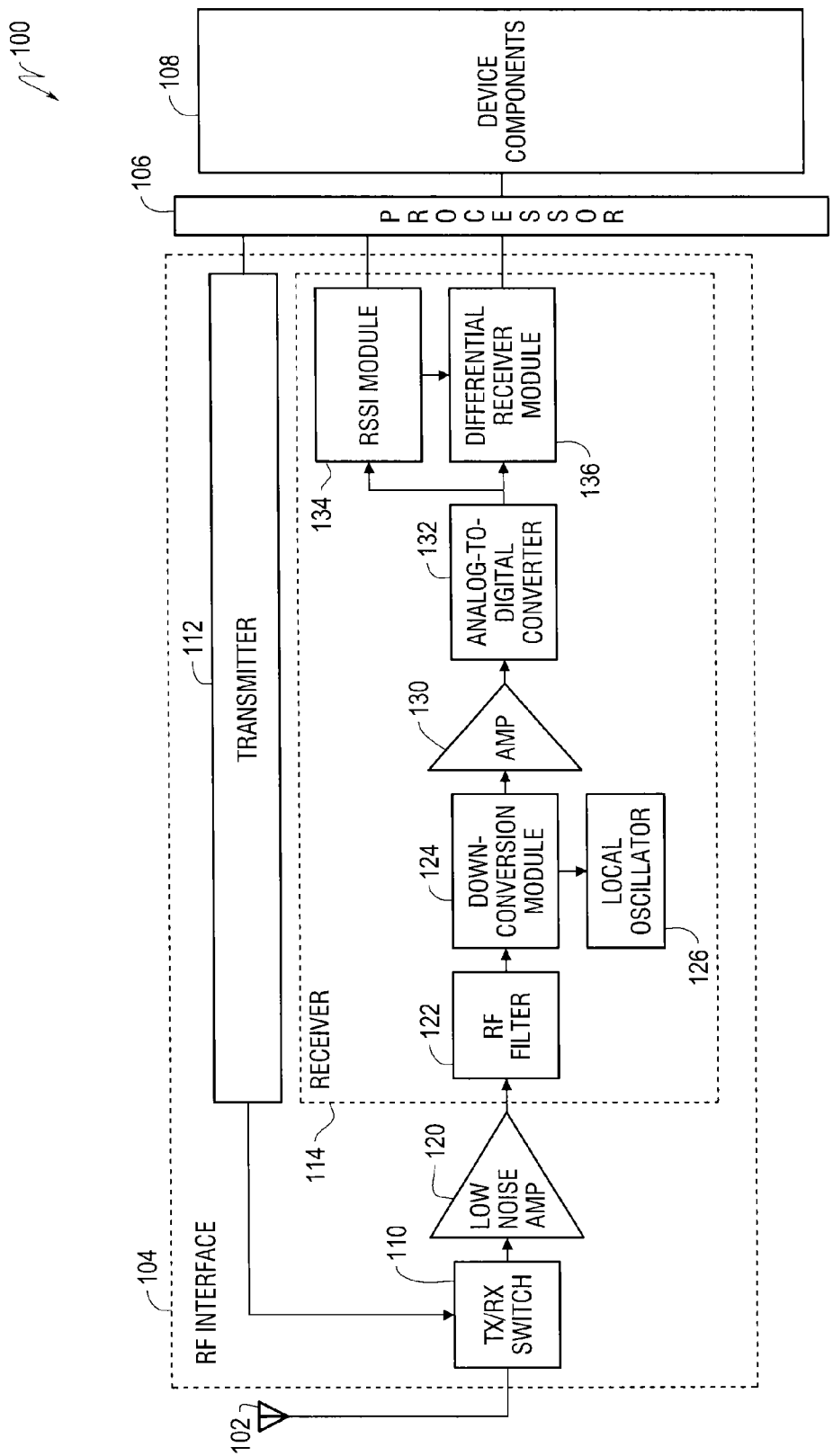
FIG. 1 is a block diagram of an example of an RF receiver/transmitter that includes an example embodiment of the robust differential receiver.

FIG. 1 is a system level block diagram of an example of a radio frequency (RF) transceiver 100 with an RF receiver 114 that includes the described robust differential receiver for a frequency modulated system. As shown in FIG. 1, RF transceiver 100 may include an RF antenna 102, an RF interface 104, a processor 106 and device components 108. RF interface 104 may include a transmitter/receiver switch 110, a low noise amplifier 120, a transmitter 112 and a receiver 114. Receiver 114 may include an RF filter 122, a down-conversion module 124, a local oscillator 126, an amplifier 130, an analog-to-digital converter 132, a received signal strength indicator (RSSI) module 134, and a differential receiver module 136. In the example embodiment shown in FIG. 1, RF filter 122, down-conversion module 124, local oscillator 126, amplifier 130, and analog-to-digital converter 132, may be referred to collectively as an example embodiment of a receiver front end.

Although not shown in FIG. 1, device components 108 may include features such as a data interface unit and a physical interface unit that allows the RF transceiver to connect to and provide RF data communication services for a device that does not inherently support such a capability. For example, in an example embodiment in which the RF transceiver is a Bluetooth RF communication device, device components 108 may include a Universal Serial Bus (USB) compatible data interface unit and a USB compatible physical interface that allows the RF transceiver to connect to and provide short range private area network (PAN) communication for any device with a USB compatible port, such as a laptop, desktop or handheld computer. However, in other example embodiments the RF transceiver may be integrated within a device such as a laptop computer, GPS receiver, cellular telephone, calculator, keyboard, mouse, printer, scanner, home appliance, hand-held radio, etc., or virtually any device that would benefit from the ability to support short range communications, such as Bluetooth class 1, class 2 and/or class 3 based communication or ULP based communication. In such embodiments, device components 108 may also include features such as a device memory, a rechargeable battery, and a user interface which may include a display, a keyboard, a speaker and/or microphone and/or any other components associated with the device in which the RF transceiver is integrated.

It is noted that although the example RF device shown in FIG. 1 is a transceiver, other embodiments may not require the ability to transmit an RF signal. In such an embodiment, the transmit/receive switch 110 and transmitter 112 shown in FIG. 1, and described above, are optional, but the RF device would retain RF receiver 114 that includes the described robust differential receiver module 136 for a frequency modulated system.

Further, it is noted that processor 106 may execute numerous signal analysis processes that may be used to generate and manage control parameters used by processor 106 to control operation of transmitter 112 and receiver 114.

In operation as a receiver, processor 106 receives from differential receiver module 136 a demodulated data stream containing, for example, digitized data received by RF transmission from a device within a PAN network. Processor 106 passes the digitized data stream to device components 108 which directs the digital data to an appropriate data destination.

For example, in operation as a receiver, low noise amplifier 120 receives an RF signal from antenna 102 via transmission/receiver switch 110. Low noise amplifier 120 amplifies the received signal by a predetermined gain and passes the amplified signal to RF filter 122.

RF filter 122 may be configured to pass a range of frequencies. The frequency range passed by RF filter 122 may include multiple communication channels, as described in greater detail below and, therefore, may pass to down-conversion module 124 a filtered RF signal that includes frequency components for multiple communication channels.

Down-conversion module 124 down-converts the received filtered RF signal using a local oscillator signal having a frequency that retains communication channel frequency components, and passes the down-converted signal to amplifier 130.

Amplifier 130 amplifies the down-converted signal and passes the amplified, down-converted signal to analog-to-digital converter 132.

Analog-to-digital converter 132 is configured to sample the down-converted signal at a predetermined sampling rate and generate a stream of baseband digital data based on the sampled values, which stream is provided to RSSI module 134 and differential receiver module 136.

Differential receiver module 136 receives the stream of baseband digital data produced by analog-to-digital converter 132, demodulates a portion of the digital data stream associated with a currently selected communication channel, and provides the demodulated digital data stream to processor 106 for further processing and/or for delivery to one or more device components 108, as described above.

RSSI module 134 generates a received signal strength estimate, for example, a received signal strength indicator (RSSI)

that is provided to processor 106 for use in monitoring and controlling operation of RF interface 104 and provided to differential receiver module 136 for use in detecting in-band interference, as described below.

Figure 2:
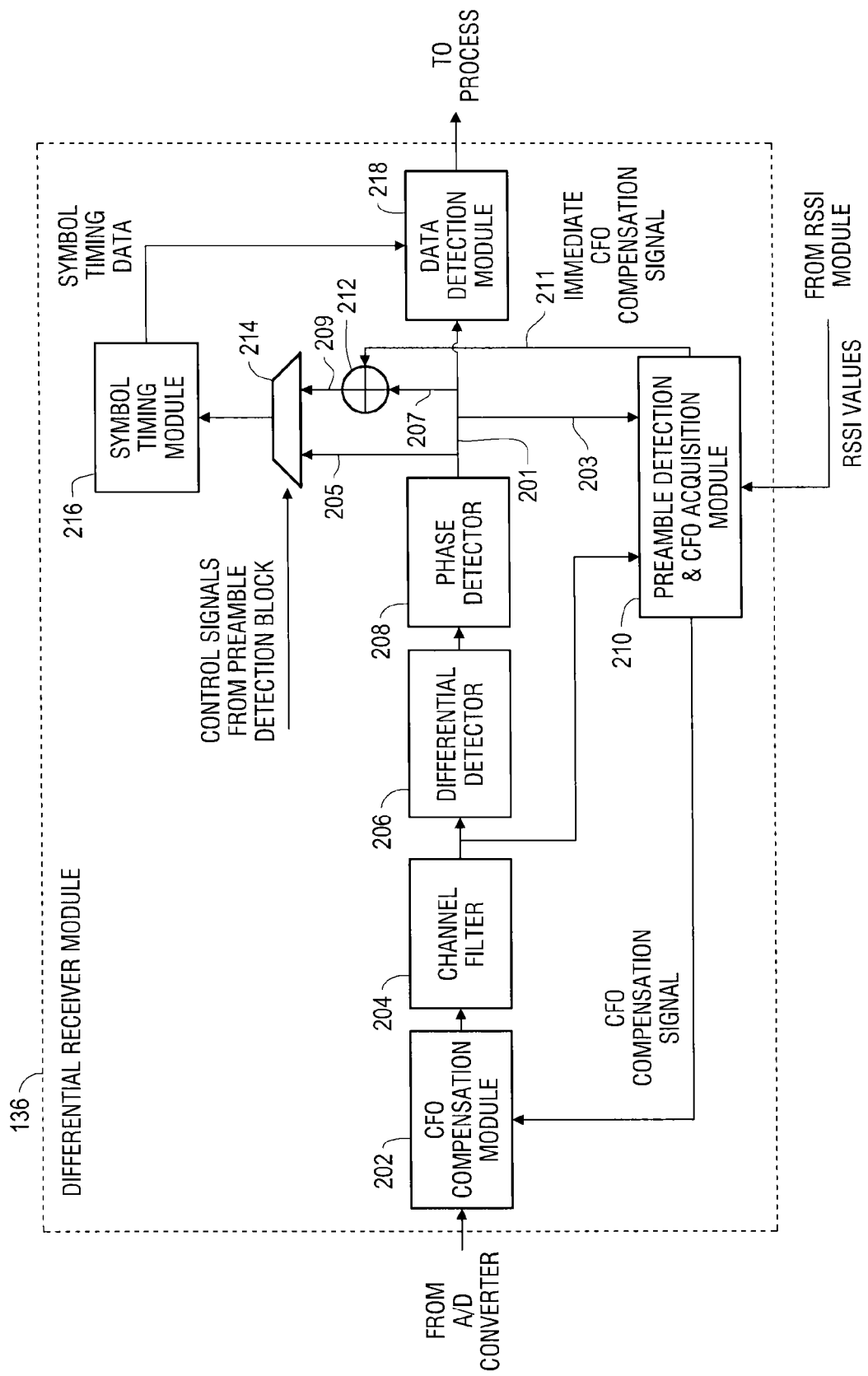
FIG. 2 is a block diagram of an example embodiment of the robust differential receiver shown in FIG. 1.

FIG. 2 is a block diagram of an example embodiment of the robust differential receiver module 136 described above with respect to FIG. 1. For example, differential receiver module 136 receives the baseband digital data stream generated by analog-to-digital converter 132 and delivers a demodulated digital data stream to processor 106. As described in greater detail below, differential receiver module 136 processes the baseband digital data to detect a communication channel within the baseband digital data and to extract data from the detected channel. For example, in one example embodiment, the communication channel is configured to detect, lock onto and decode a Gaussian Frequency Shift Keying (GFSK) encoded channel.

As shown in FIG. 2, differential receiver module 136 includes a carrier frequency offset (CFO) compensation module 202, a channel filter 204, a differential detector 206, a phase detector 208, a preamble detection and CFO acquisition module 210, an adder 212, a digitally controlled multiplexor 214, a symbol timing module 216 and a data detection module 218.

In operation, CFO compensation module 202 receives baseband digital data from analog-to-digital converter 132 and applies a CFO compensation signal produced by preamble detection and CFO acquisition module 210 to compensate the received signal, in the frequency domain, for a carrier frequency offset (CFO) determined by preamble detection and CFO acquisition module 210, as described in greater detail below. CFO compensation module 202 passes the CFO compensated baseband digital data stream to channel filter 204. In one embodiment, channel filter 204 is a low pass filter.

Channel filter 204 filters the received CFO compensated baseband digital data stream and filters out frequency components that are outside of a desired frequency range and passes the filtered baseband digital data stream to differential detector 206. For example, in one example embodiment, channel filter 204 is an adjacent channel rejection (ACR) channel filter which is configurable to filter high frequency components outside of a frequency band associated with a selected channel range.

Differential detector 206 determines a change in frequency, $\Delta f$, over a predetermined period, e.g., a one-symbol period, $f_n - f_{n-1}$, and passes the determined $\Delta f$ data to phase detector 208.

In one embodiment, phase detector 208 determines a change in phase, $\Delta \psi_n$, e.g., over a one-symbol period, $\psi_n - \psi_{n-1}$, based on the change in frequency, $\Delta f$, data provided by differential detector 206 based on the relationship shown in equation 1.

$$\Delta \psi = 2\pi \Delta f * T \qquad \text{EQ. 1}$$

Where $\Delta \psi$ is a change in phase;
$\Delta f$ is a change in frequency over a symbol period; and
T is a predetermined time period, e.g. a one-symbol period.

As shown in FIG. 2, the output of phase detector 208 is provided to each of data detection module 218 (via connection 201), preamble detection and CFO acquisition module 210 (via connection 203), and symbol timing module 216 (via digital multiplexor 214 and one of connections 205 and 209). For example, digital multiplexor 214 may forward to symbol timing module 216 output of phase detector 208 received on connection 205, or corrected phased detector output received from adder 212 via connection 209, based on a control signal provided by preamble detection and CFO acquisition module 210. Processing performed by preamble detection and CFO acquisition module 210, symbol timing module 216 and data detection signal timing may be determined based on the peak output of the correlator. Once a preamble is detected, preamble detection and CFO acquisition module 210 performs CFO acquisition.

In performing CFO acquisition, (in one embodiment) preamble detection and CFO acquisition module 210 uses the peak values of the signal preamble determined during the preamble detection process. For example, a carrier frequency offset may be generated as an average of the determined peak values, or may be generated as an average over all the samples within the preamble to provide a more precise estimation. Once the carrier frequency offset is determined, preamble detection and CFO acquisition module 210 generates a CFO compensation signal that is provided to CFO compensation module 202 and used to compensate the received baseband digital data stream for the determined carrier frequency offset in the frequency domain. Further, once the carrier frequency offset is determined, preamble detection and CFO acquisition module 210 generates an immediate CFO compensation signal that may be provided to adder 212 and that may be used to compensate the output of phase detector 208 prior to delivery to symbol timing module 216, as described in greater detail below.

Symbol timing module 216 is responsible for processing the output of phase detector 208 to generate symbol timing data used by data detection module 216 to decode the received payload. For example, a communication data channel data stream may contain a predetermined preamble that is the same for all communication channel data streams, followed by a fixed length access code, followed by a variable length data payload. The access code, e.g., a 32-bit access code, may contain symbol timing information and data payload length data that is needed by symbol timing module 216 and data detection module to correlate and demodulate the received data stream. Once the access code is extracted, symbol timing module 216 uses the symbol timing information contained within the access code to generate symbol timing data for the data payload based on CFO compensated phase detector output, and provides payload symbol timing data to data detection module 218 data until the full data payload is demodulated.

As described above, preamble detection and CFO acquisition module 210 may perform phase ambiguity correction for channel signals that exhibit phase ambiguity during the preamble detection process, and may generate a CFO compensation signal that is provided to CFO compensation module 202 to compensate the output of phase detector 208 based on the generated CFO. By correcting for phase ambiguity during the preamble detection process, the differential receiver is able to detect channels that otherwise may have been ignored and may generate a more accurate CFO value. By compensating the remaining portions of the channel signal for a CFO based on the corrected preamble, the differential receiver assures that ambiguities that would likely occur with respect to the access code and payload are avoided. The use of such preamble correction and CFO compensation techniques results in a differential receiver that is more robust and more reliable than other differential receivers with respect to the ability to lock onto and to maintain a stable channel connection.

It is noted that CFO compensation may be performed regardless of whether or not phase ambiguities are detected within the preamble. Compensating for a detected CFO, maximizes the reliability, stability and robustness of the differential receiver by minimizing the likelihood that phase ambiguities in the access code and payload portions of the signal are encountered.

As described above, the access code of a channel data stream immediately follows the preamble of the channel data stream. By compensating for a determined CFO in the phase domain via CFO compensation module 202, portions of the channel data stream which have already passed from the CFO compensation module 202 before the CFO compensation signal from preamble detection and CFO acquisition module 210 is applied are not CFO compensated. For example, uncompensated portions of the channel data stream which have passed from the CFO compensation module 202 before arrival of the CFO compensation signal, to be further processed by channel filter 204, differential detector 206 and phase detector 208, may continue to emerge from phase detector 208 for a processing delay period, or loop delay, that is equal to the combined processing delay introduced by channel filter 204, differential detector 206 and phase detector 208.

Therefore, in addition to the CFO compensation signal sent to CFO compensation module 202 to compensate for the determined CFO in the frequency domain, preamble detection and CFO acquisition module 210 may also generate an immediate CFO compensation signal that may be added via adder 212 to the output of phase detector 208. For example, in one example embodiment, preamble detection and CFO acquisition module 210, at the start of a preamble detection process, applies a first control signal, e.g., 00, to digital multiplexor 214 that blocks any input signals from passing through digital multiplexor 214 to symbol timing module 216. combined processing delay introduced by channel filter 204, differential detector 206 and phase detector 208.

Therefore, in addition to the CFO compensation signal sent to CFO compensation module 202 to compensate for the determined CFO in the frequency domain, preamble detection and CFO acquisition module 210 may also generate an immediate CFO compensation signal that may be added via adder 212 to the output of phase detector 208. For example, in one example embodiment, preamble detection and CFO acquisition module 210, at the start of a preamble detection process, applies a first control signal, e.g., 00, to digital multiplexor 214 that blocks any input signals from passing through digital multiplexor 214 to symbol timing module 216. However, once a preamble is detected and an immediate CFO compensation signal has been applied to adder 212, CFO acquisition module 210 applies a second control signal, e.g., 01, to digital multiplexor 214 that allows the compensated phase detector output signal to pass from adder 212 to symbol timing module 216, but does not allow the uncompensated phase detector output signal to pass from phase detector 208 to symbol timing module 216. After a predetermined period of time equal to the loop delay of channel filter 204, differential detector 206 and phase detector 208, preamble detection and CFO acquisition module 210 applies a third control signal, e.g., 10, to digital multiplexor 214 that allows a compensated phase detector output signal to pass directly from phase detector 208 to symbol timing module 216, and shuts off the data stream received from adder 212. In this manner, once the output of phase detector 208 is based on portions of the channel signal stream which have been CFO compensated by CFO compensation module 202, the compensated phase detector output is passed directly to symbol timing module 216, and use of adder 212 may be discontinued.

Data detection module 218, upon receiving symbol timing data from symbol timing module 216 begins processing CFO compensated output received directly from phase detector 208. For example, assuming that the output of phase detector 208 represents GFSK encoded data, data detection module 218 may apply a GFSK demodulator to generate a demodulated digital data stream based on the phase data received from phase detector 208 and the timing data received from symbol timing module 216.

Figure 3:
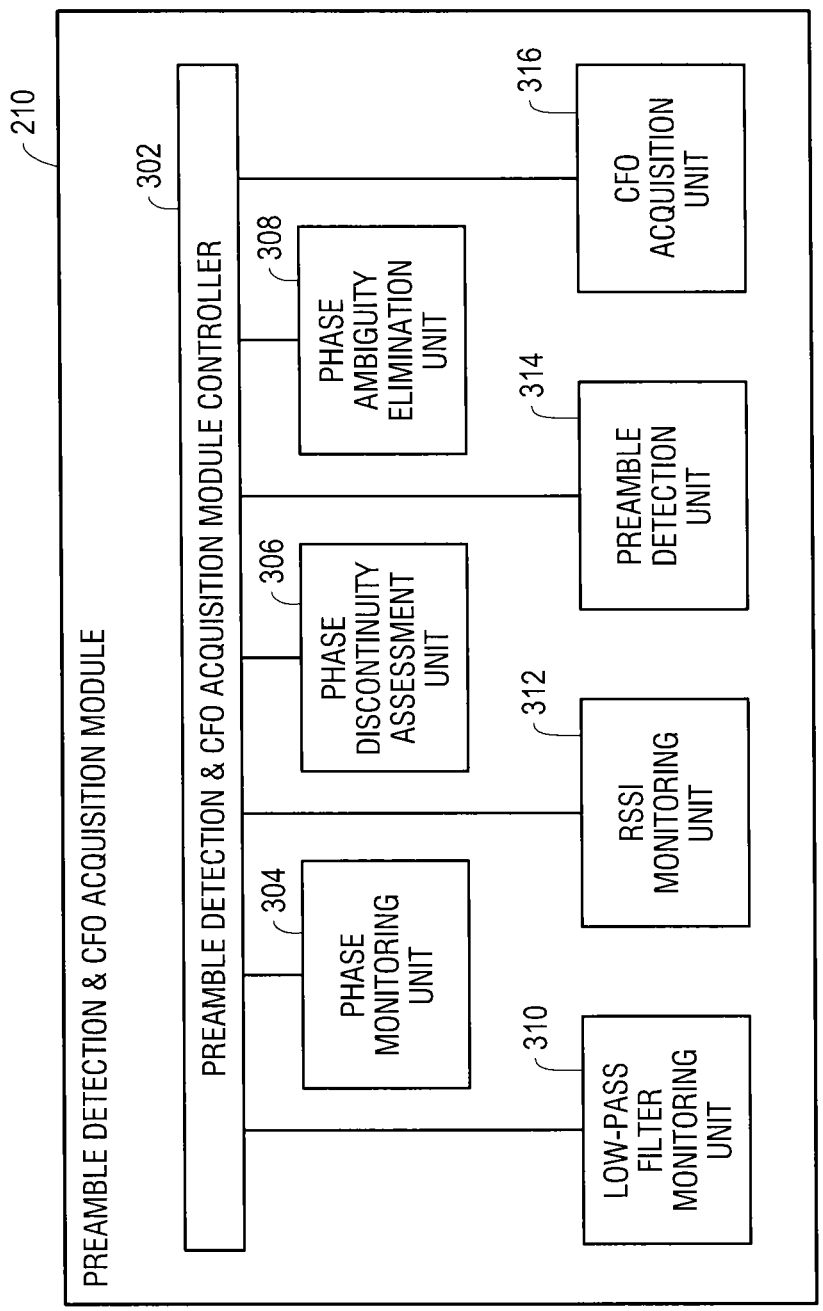
FIG. 3 is a block diagram of an example embodiment of a preamble detection and CFO acquisition module shown in FIG. 2.

FIG. 3 is a block diagram of an example embodiment of preamble detection and CFO acquisition module 210, as described above with respect to FIG. 2. As shown in FIG. 3, the example embodiment of preamble detection and CFO acquisition module 210 includes a preamble detection and CFO acquisition module controller 302, a phase monitoring unit 304, a phase discontinuity assessment unit 306, a phase ambiguity elimination unit 308, a low-pass filter monitoring unit 310, an RSSI monitoring unit 312, a preamble detection unit 314, and a CFO acquisition unit 316.

As described below, operation of phase monitoring unit 304, phase discontinuity assessment unit 306 and phase ambiguity elimination unit 308 may be coordinated by preamble detection and CFO acquisition module controller 302 to identify and correct phase ambiguities in a received data stream so that preamble detection unit 314 may work to correlate an ambiguity free data stream with a predetermined preamble sequence.

As also described below, operation of low-pass monitoring unit 310 and RSSI monitoring unit 312 may be coordinated by preamble detection and CFO acquisition module controller 302 to identify in-band and out-of-band interference in a received data stream while preamble detection unit 314 works to correlate the received corrected/ambiguity-free data stream with a predetermined preamble sequence. Detecting such interference during the preamble detection process may prevent preamble detection unit 314 from detecting a preamble based on a weak or distorted signal, and thereby may prevent CFO acquisition unit 316 from generating erroneous CFO estimates which would otherwise likely result in transmission errors and possible packet loss.

In operation, preamble detection and CFO acquisition module controller 302 maintains a workflow state machine, and/or control parameters that allow each of the respective units described below to perform its assigned task. For example, preamble detection and CFO acquisition module controller 302 monitors the output of low-pass filter monitoring unit 310 and RSSI monitoring unit 312 and reinitiates the preamble detection process upon determining that the preamble detection has been triggered by out-of-band interference, or upon determining that a CFO calculated based on a detected preamble may be incorrect due to the presence of in-band interference. Further, preamble detection and CFO acquisition module controller 302 may monitor the output of phase monitoring unit 304 and may initiate operation of phase discontinuity assessment unit 306 and phase ambiguity elimination unit 308, as described below, upon detection of a phase ambiguity during the preamble detection process. In addition, preamble detection and CFO acquisition module controller 302 may generate the control signals provided to digital multiplexor 214, shown in FIG. 2, based on a state machine, control parameters and timers maintained by preamble detection and CFO acquisition module controller 302 based on feedback received from preamble detection unit 314 and CFO acquisition unit 316.

Phase monitoring unit 304 may be initiated by preamble detection and CFO acquisition module controller 302 to monitor the output of phase detector 208 during the preamble detection process performed by preamble detection unit 314. Phase monitoring unit 304 assesses the variation in the phase in over a predetermined period, e.g., a one-symbol period, and if the variation exceeds a predetermined threshold, e.g., π, phase monitoring unit 304 informs preamble detection and CFO acquisition module controller 302 that a phase ambiguity has been detected.

Phase discontinuity assessment unit 306 may be initiated by preamble detection and CFO acquisition module controller 302 in response to a notification from phase monitoring unit 304 that a phase ambiguity has been detected. For example, the phase ambiguity may be eliminated by comparing two adjacent phase values. If a frequency offset is large enough to make a phase difference of two adjacent phase values larger than $2\pi$, the value may be wrapped back by adding or subtracting it. For example, assuming that $\alpha_1$ and $\alpha_2$ are consecutive phase values generated by phase detector 208, shown in FIG. 2, and $0<\alpha_1<\pi$, and $0<\alpha_2<2\pi$, then $\alpha_2$ may be wrapped to $\alpha'_2$ by subtracting $2\pi$ from $\alpha_2$, i.e., $\alpha'_2=\alpha_2-2\pi$. Therefore, $|\alpha'_2-\alpha_1|=|\alpha_2-\alpha_1-2\pi|>=|2\pi-|\alpha_2-\alpha_1||>\pi$. Hence, a discontinuous phase value that is the result of a phase ambiguity may be wrapped back by adding or subtracting $\pi$. Using such an approach, phase discontinuity assessment unit 306 assesses consecutive phase values $\alpha_1$ and $\alpha_2$ and determines whether $+\pi$ or $-\pi$ should be added to $\alpha_2$ to eliminate the ambiguity.

Phase ambiguity elimination unit 308 may be initiated by preamble detection and CFO acquisition module controller 302 to repair ambiguities in the phase data generated by phase detector 208 prior to passing the affected phase values to preamble detection unit 314. As described above with respect to phase discontinuity assessment unit 306, phase ambiguity elimination unit 308 may eliminate the ambiguity by adding either $+\pi$ or $-\pi$ to $\alpha_2$, as determined by phase discontinuity assessment unit 306.

Low-pass filter monitoring unit 310 may be initiated by preamble detection and CFO acquisition module controller 302 to monitor the output of channel filter 204, shown in FIG. 2, to detect sudden changes in the output of channel filter 204. For example, in one example embodiment, low-pass filter monitoring unit 310 is configured with two reporting thresholds. A first threshold may be triggered upon detection of a significant change, e.g., a sudden positive or negative change of greater than 150% over a period of 10-20 μsec. A second threshold may be triggered upon detection of a large change, e.g., a sudden positive or negative change of greater than 100% over a period of 10-20 μsec. Each time the output of channel filter 204 exceeds a reporting threshold, the event may be reported to preamble detection and CFO acquisition module controller 302, as described in greater detail below.

RSSI monitoring unit 312 may be initiated by preamble detection and CFO acquisition module controller 302 to monitor the output of RSSI module 134, shown in FIG. 1, to detect sudden changes in the output of RSSI module 134. For example, in one example embodiment, RSSI monitoring unit 312 is configured with a reporting threshold that may be triggered upon detection of a significant change, e.g., a sudden positive or negative change of greater than 200% over a period of 10-20 μsec. Each time the output of RSSI module 134 exceeds a reporting threshold, the event may be reported to preamble detection and CFO acquisition module controller 302, as described in greater detail below.

In-band interference may include interference with a center frequency that is within 1 MHz from the desired signal. Out-of-band interference may include interference with a center frequency that at least 1 MHz from the desired signal. Each type of interference may falsely trigger a preamble detection, and/or may result in an incorrect CFO estimation for the desired channel. For this reason, preamble detection and CFO acquisition module 210, monitors for both in-band and out-of-band interference during the preamble detection process, as described in greater detail below.

For example, a significant positive or negative change in the output of channel filter 204 during a preamble detection period may indicate that the preamble detection process was triggered by out-of-band interference. Therefore, if preamble detection and CFO acquisition module controller 302 receives a report from low-pass filter monitoring unit 310, during a preamble detection period, indicating a significant positive or negative change in the output of channel filter 204, preamble detection and CFO acquisition module controller 302 may instruct preamble detection unit 314 to drop any CFO values calculated during the current preamble detection period and to reinitiate the preamble detection process.

Further, a large positive or negative change in the output of channel filter 204 that coincides with a large change in the output of RSSI module 134, during a preamble detection period, may indicate the presence of in-band interference that may adversely affect the accuracy of a CFO value generated from preamble data values that include points collected during the period of in-band interference. Therefore, if preamble detection and CFO acquisition module controller 302 receives, during a preamble detection period, a report from low-pass filter monitoring unit 310 indicating a large positive or negative change in the output of channel filter 204 that coincides with a report from RSSI monitoring unit 312 indicating a significant change in the output of RSSI module 134, preamble detection and CFO acquisition module controller 302 may instruct preamble detection unit 314 to drop any CFO values calculated during the current preamble detection period and to reinitiate the preamble detection process.

Preamble detection unit 314 may be initiated by preamble detection and CFO acquisition module controller 302 to detect a preamble based on phase data generated by phase detector 208. The phase data received by preamble detection unit 314 may be uncorrected/ambiguity-free phase data unchanged from that generated by phase detector 208 or may be phase data generated by phase detector 208 in which one or more phase ambiguities have been corrected. Preamble detection unit 314 may correlate the received phase values with a predetermined preamble pattern, as described above, and may report to a preamble match to preamble detection and CFO acquisition module controller 302.

CFO acquisition unit 316 may be initiated by preamble detection and CFO acquisition module controller 302 upon receipt of a notification from preamble detection unit 314 that a preamble has been successfully detected. CFO acquisition unit 316 may be initiated to generate CFO correction values based on the peak data values or all data values associated with the detected preamble, as described above. The generated CFO value may be stored and may be used by preamble detection and CFO acquisition module controller 302 to generate the CFO compensation signal sent from preamble detection and CFO acquisition module 210 to CFO compensation module 202, and to generate the immediate CFO compensation signal sent from preamble detection and CFO acquisition module 210 to adder 212, as described above with respect to FIG. 2.

Figure 4:
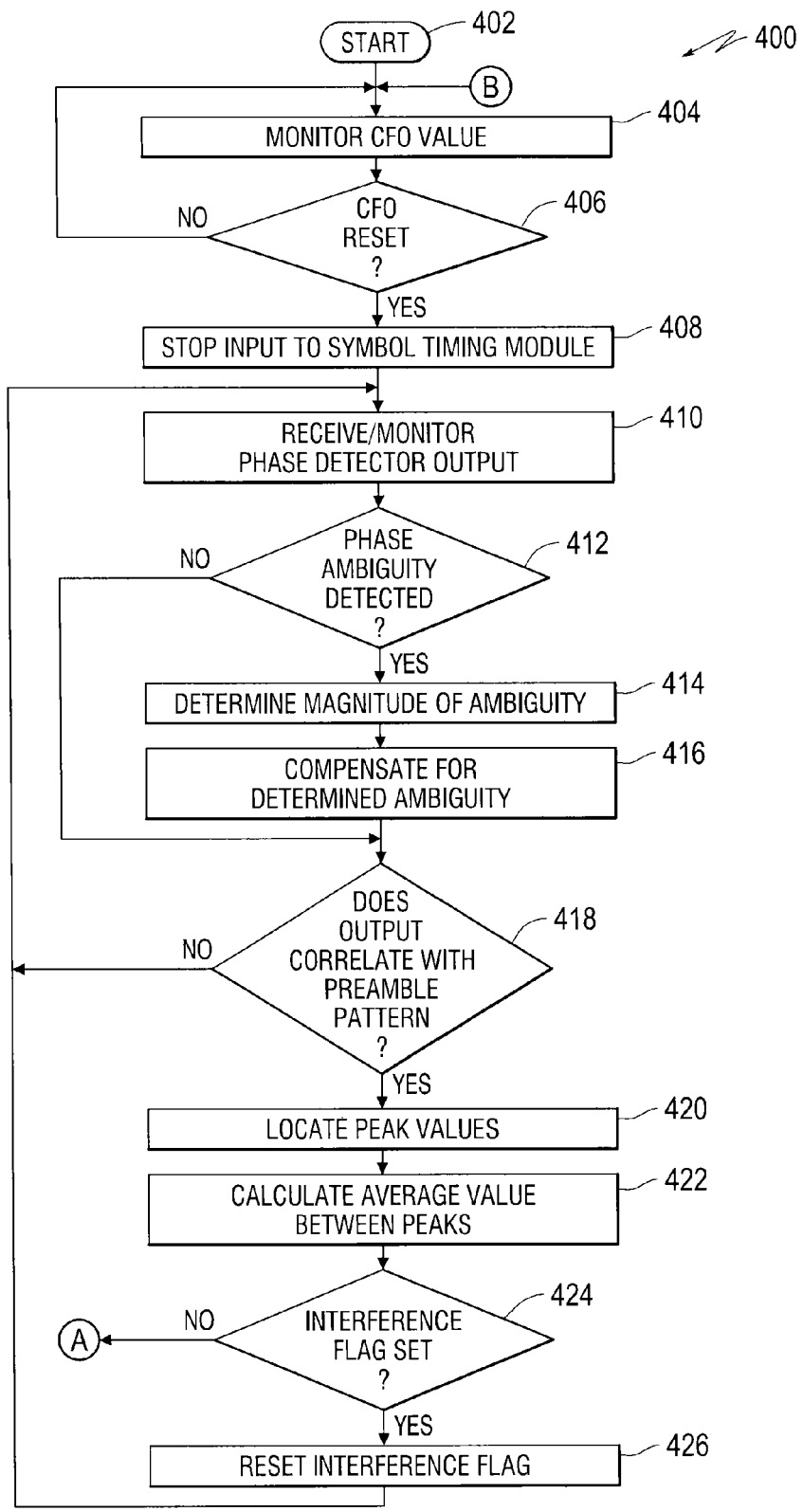
FIG. 4 and FIG. 5 show a flow-chart of an example process for preamble detection and CFO acquisition in an example embodiment of the robust differential receiver described above with respect to FIG. 2.
Figure 5:
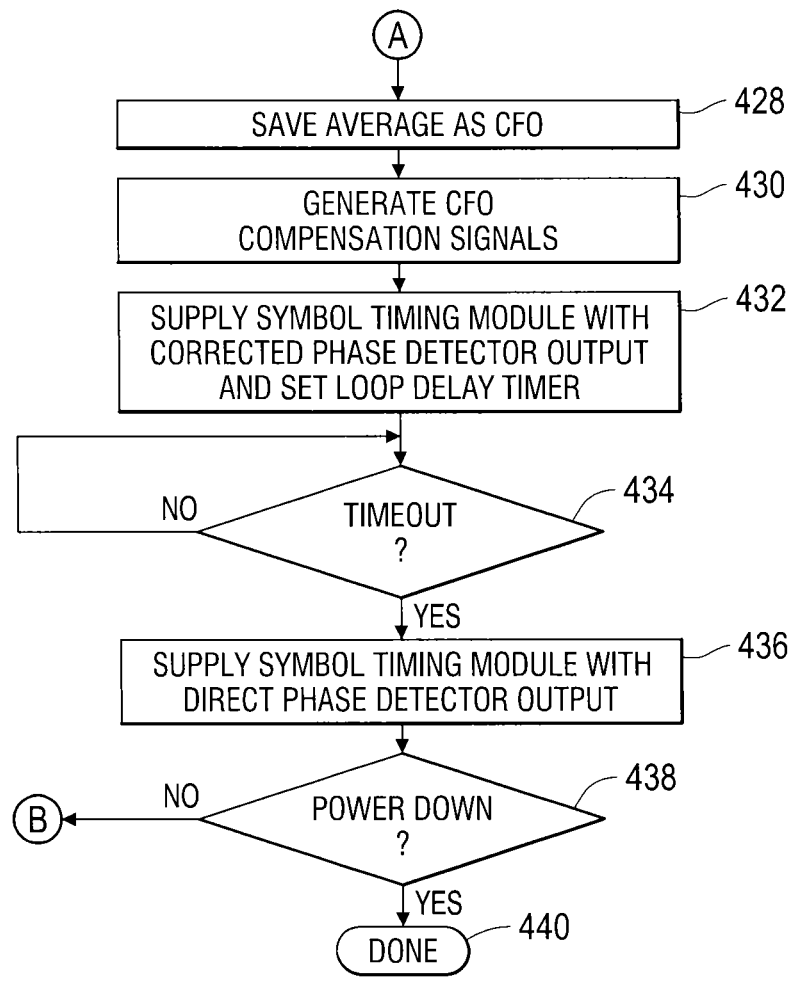

FIG. 4 and FIG. 5 show a flow-chart of an example process for performing preamble detection and CFO acquisition in an example embodiment of the robust differential receiver described above with respect to FIG. 2. It is assumed that the process described below is performed in parallel with an in-band and out-of-band interference detection process, as described above, and as described below with respect to FIG. 6. The two respective processes may interact based on values stored and maintained by preamble detection and CFO acquisition module controller 302. For example, the CFO value generated by CFO acquisition unit 316 and maintained by preamble detection and CFO acquisition module controller 302 may be accessible to both example processes. In the example process described above with respect to FIG. 4 and FIG. 5, a null CFO value may indicate that a previously determined CFO value is no longer valid and that a preamble detection process is either in progress, or about to be initiated. A non-null CFO value may indicate that a preamble detection process has been successfully completed, i.e., free of in-band and out-of-band distortion, and a valid CFO value has been generated and stored. Further, an interference flag maintained by preamble detection and CFO acquisition module controller 302 may also be accessible to both processes. For example, an interference flag in a "set" state may indicate that one or more of in-band and out-of-bad interference has been detected during a preamble detection process, and an interference flag in a "reset" state may indicate that no such interference has yet been detected during a current preamble detection process. As shown in FIG. 4, operation of the process begins at step 402 and proceeds to step 404.

In step 404, preamble detection and CFO acquisition module controller 302 begins monitoring the value of the CFO value generated by CFO acquisition unit 316, and operation of the process continues to step 406.

If, in step 406, preamble detection and CFO acquisition module controller 302 determines that the CFO value has been reset to null, operation of the process continues to step 408, otherwise, operation of the process continues to step 404.

In step 408, preamble detection and CFO acquisition module controller 302 updates the control signal provided to digital multiplexor 214, shown in FIG. 2, to stop the flow of phase values to symbol timing module 216, and operation of the process continues to step 410.

In step 410, preamble detection and CFO acquisition module controller 302 receives phase data from phase detector 208 and initiates phase monitoring unit 304, low-pass filter monitoring unit 310 and RSSI monitoring unit 312, and operation of the process continues to step 412.

If, in step 412, preamble detection and CFO acquisition module controller 302 receives a report from phase monitoring unit 304 that a phase ambiguity has been detected, operation of the process continues to step 414, otherwise, operation of the process continues to step 418.

In step 414, phase discontinuity assessment unit 306 determines the magnitude of the detected ambiguity, and operation of the method continues to step 416.

In step 416, phase ambiguity elimination unit 308 corrects the detected ambiguity based on the magnitude of the detected ambiguity determined by phase discontinuity assessment unit 306, and operation of the process continues to step 418.

If, in step 418, preamble detection unit 314 reports a preamble detection, operation of the process continues to step 420, otherwise, operation of the process continues to step 410.

In step 420, CFO acquisition unit 316 locates peak values of the detected preamble, and operation of the process continues to step 422.

In step 422, CFO acquisition unit 316 calculates an average based on either the detected peak values, or all phase values, associated with the detected preamble, and operation of the process continues to step 424.

If, in step 424, preamble detection and CFO acquisition module controller 302 determines that the interference flag is in a "set" state, i.e., indicating that at least one of an out-of-band and in-band interference was detected during the preamble detection process, operation of the process continues to step 426, otherwise, operation of the process continues to step 428.

In step 426, preamble detection and CFO acquisition module controller 302 resets the interference flag, and operation of the process continues to step 410.

In step 428, CFO acquisition unit 316 saves the calculated average as the new CFO value, and operation of the process continues to step 430.

In step 430, preamble detection and CFO acquisition module controller 302 generates CFO compensation signals provided to CFO compensation module 202 and adder 212, and operation of the process continues to step 432.

In step 432, preamble detection and CFO acquisition module controller 302 updates the control signal provided to digital multiplexor 214 to allow corrected phase detector output to pass from adder 212 to symbol timing module 216, as described above, and may set a loop delay timer, as described above, and operation of the process continues to step 434.

If, in step 434, a loop delay timer timeout is detected, operation of the process continues to step 436, otherwise, operation of the process continues to step 434.

In step 436, preamble detection and CFO acquisition module controller 302 updates the control signal provided to digital multiplexor 214 to allow phase detector output to pass from phase detector 208 to symbol timing module 216, as described above, and operation of the process continues to step 438.

If, in step 438, a power down of the receiver device is detected, operation of the process continues to step 440 and the process terminates, otherwise, operation of the process continues to step 404.

Figure 6:
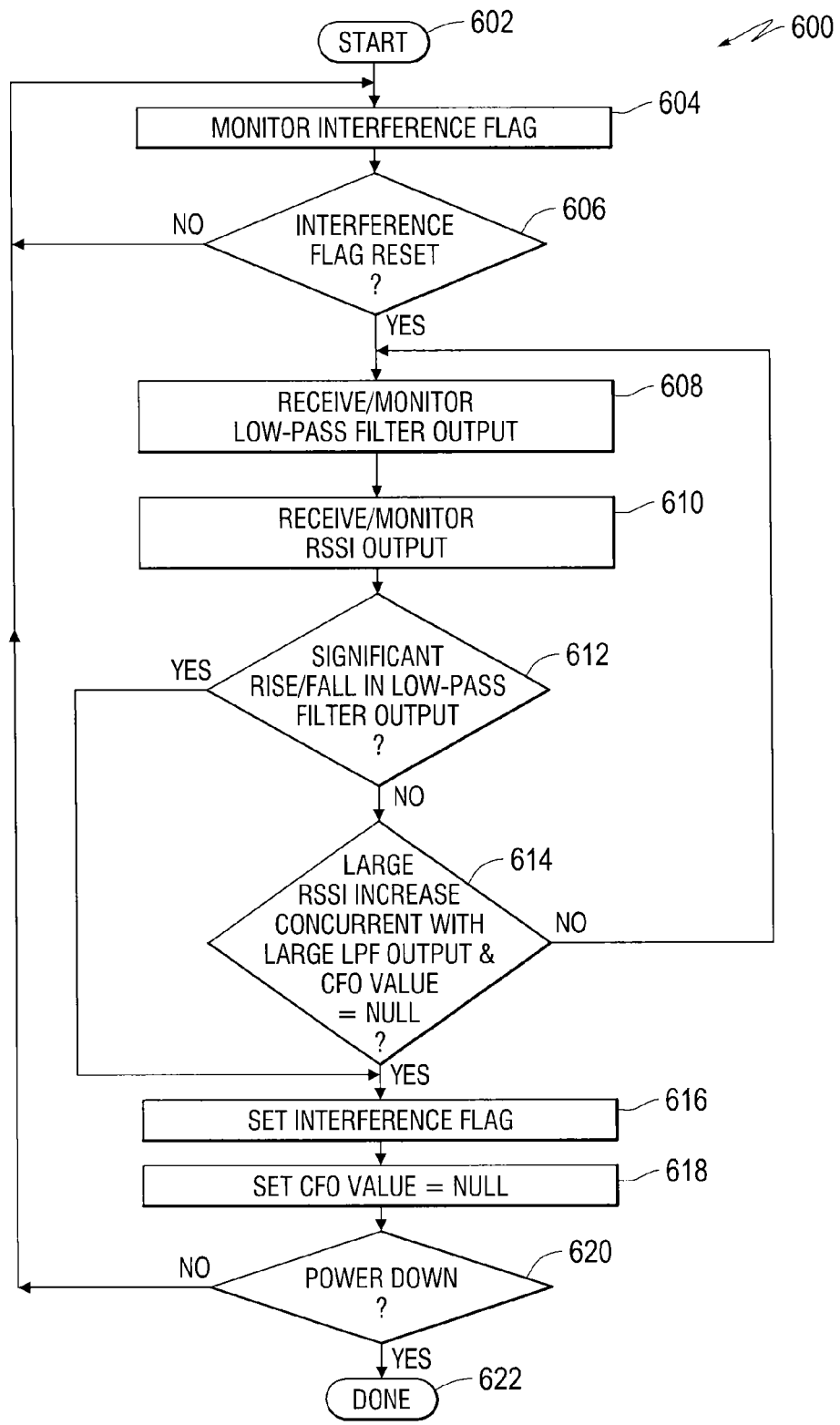
FIG. 6 shows a flow-chart of an example process for performing in-band and out-of-band interference detection in an example embodiment of the robust differential receiver described above with respect to FIG. 2.

FIG. 6 shows a flow-chart of an example process for performing in-band and out-of-band interference detection in an example embodiment of the robust differential receiver described above with respect to FIG. 2. It is assumed that the process described below is performed in parallel with the preamble detection and CFO acquisition process described above with respect to FIG. 4 and FIG. 5. The two respective processes may interact based on values stored and maintained by preamble detection and CFO acquisition module controller 302. For example, the CFO value generated by CFO acquisition unit 316 and maintained by preamble detection and CFO acquisition module controller 302 may be accessible to both example processes. In the example process described below with respect to FIG. 6, a null CFO value indicates that a previously determined CFO value is no longer valid and that a preamble detection process is either in progress, or about to be initiated. A non-null CFO value indicates that a preamble detection process has been successfully completed, i.e., free of in-band and out-of-band distortion, and a valid CFO value has been generated and stored. Further, an interference flag maintained by preamble detection and CFO acquisition module controller 302 may also be accessible to both processes. For example, an interference flag in a "set" state may indicate that one or more of in-band and out-of-bad interference has been detected during a preamble detection process, and an interference flag in a "reset" state may indicate that no such interference has yet been detected during a current preamble detection process. As shown in FIG. 6, operation of the process begins at step 602 and proceeds to step 604.

In step 604, preamble detection and CFO acquisition module controller 302 begins monitoring the interference flag, described above, and operation of the process continues to step 606.

If, in step 606, preamble detection and CFO acquisition module controller 302 determines that the interference flag is in a reset state, operation of the process continues to step 608, otherwise, operation of the process continues to step 604.

In step 608, low-pass filter monitoring unit 310 begins receiving/monitoring output generated by channel filter 204 (e.g., a low-pass filter), and operation of the process continues to step 610.

In step 610, RSSI monitoring unit 312 begins receiving/monitoring RSSI values generated by RSSI module 134, and operation of the process continues to step 612.

If, in step 612, low-pass filter monitoring unit 310 reports to preamble detection and CFO acquisition module controller 302 a significant positive or negative change in the output of channel filter 204, operation of the process continues to step 616, otherwise, operation of the process continues to step 614.

If, in step 614, preamble detection and CFO acquisition module controller 302 determines that a large positive or negative change in the output of channel filter 204, reported by low-pass filter monitoring unit 310, has occurred concurrently with a significant increase in the magnitude of RSSI values reported by RSSI monitoring unit 312, and the CFO value is null, operation of the process continues to step 616, otherwise, operation of the process continues to step 608.

In step 616, preamble detection and CFO acquisition module controller 302 places the interference flag in a "set" state, and operation of the process continues to step 618.

In step 618, preamble detection and CFO acquisition module controller 302 sets the CFO value to "null," and operation of the process continues to step 620.

If, in step 620, a power down of the receiver device is detected, operation of the process continues to step 622 and the process terminates, otherwise, operation of the process continues to step 604.

Figure 7:
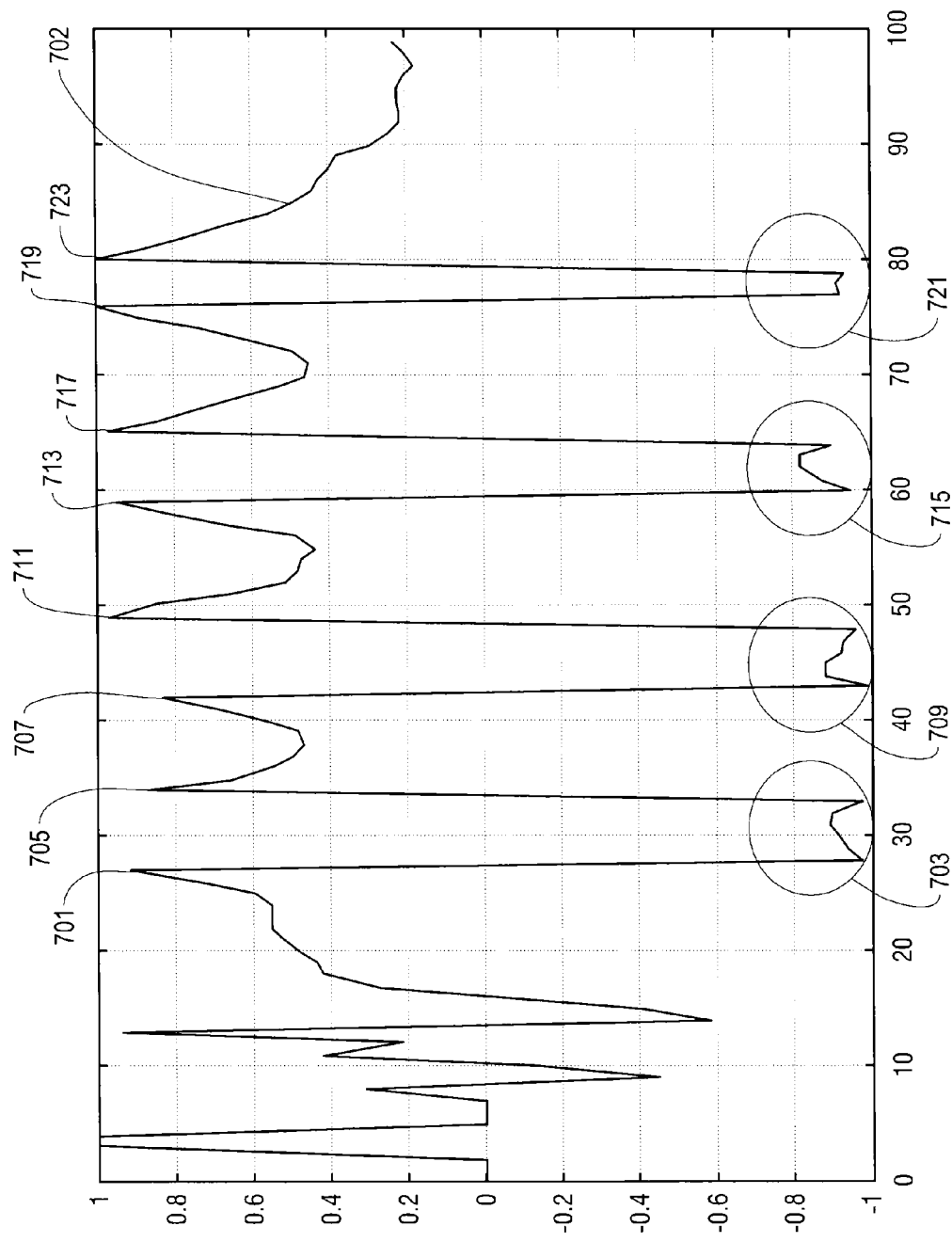
FIG. 7 shows a plot of an example signal that suffers from multiple example phase ambiguities.

FIG. 7 shows a plot of an example signal 702 that suffers from multiple example phase ambiguities. As shown in FIG. 7, phase ambiguity 703 occurs between point 701 and 705, phase ambiguity 709 occurs between point 707 and 711, phase ambiguity 715 occurs between point 713 and 717, and phase ambiguity 721 occurs between point 719 and 723. As described above, even if such a signal could achieve preamble detection, a CFO value based on such preamble peaks or preamble data values would not likely be representative of the true CFO for the signal, i.e., would likely be highly inaccurate, and attempts to extract access codes and payload data after having adjusted a signal with such an inaccurate CFO may likely result in transmission errors and possible packet loss.

Figure 8:
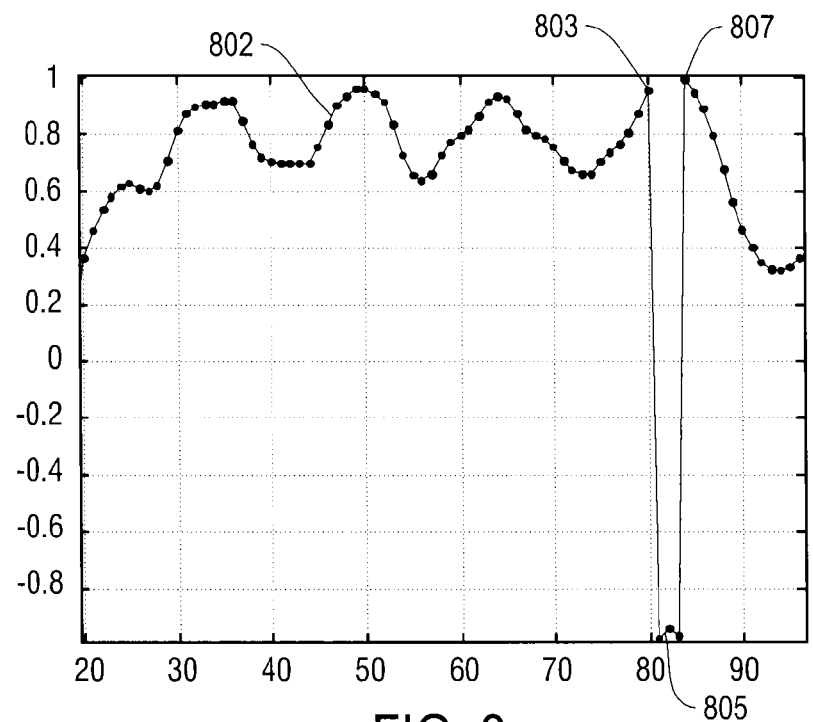
FIG. 8 shows a plot of an example signal that suffers from an example phase ambiguity.

FIG. 8 shows a plot of an example signal 802 that suffers from an example phase ambiguity. As shown in FIG. 8, phase ambiguity 805 occurs between point 803 and 807.

Figure 9:
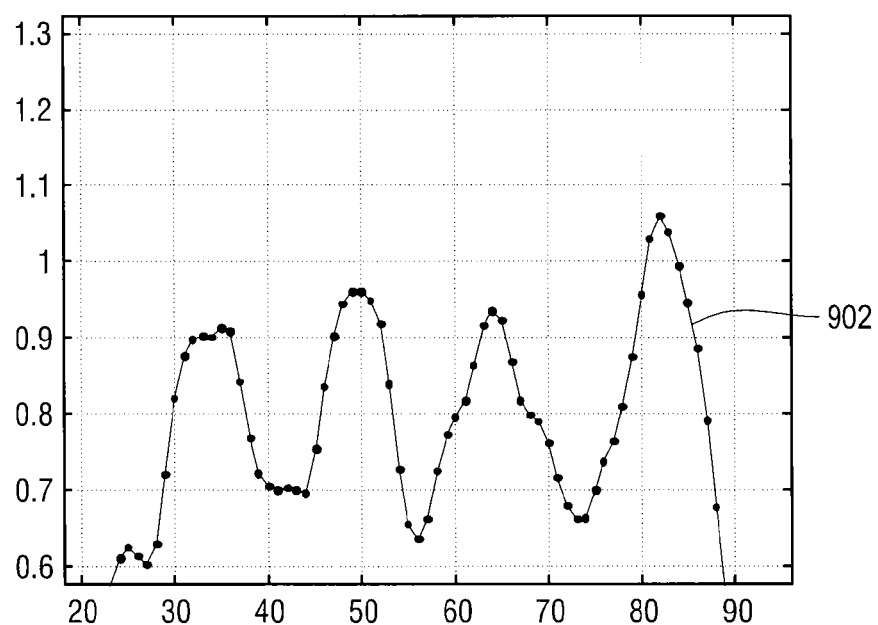
FIG. 9 shows a plot of FIG. 8, after the example phase ambiguity has been corrected by an example embodiment of the preamble detection and CFO acquisition module shown in FIG. 2 and FIG. 3.

FIG. 9 shows a plot 902 based on the same data presented in the plot of FIG. 8, in which the phase ambiguity, shown in FIG. 8 at 805, has been corrected and a determined CFO offset has been calculated and applied to the data values using an example embodiment of the preamble detection and CFO acquisition module described above with respect to FIG. 2 and FIG. 3, using the example processes described above with respect to FIG. 4, FIG. 5 and FIG. 6.

Figure 10:
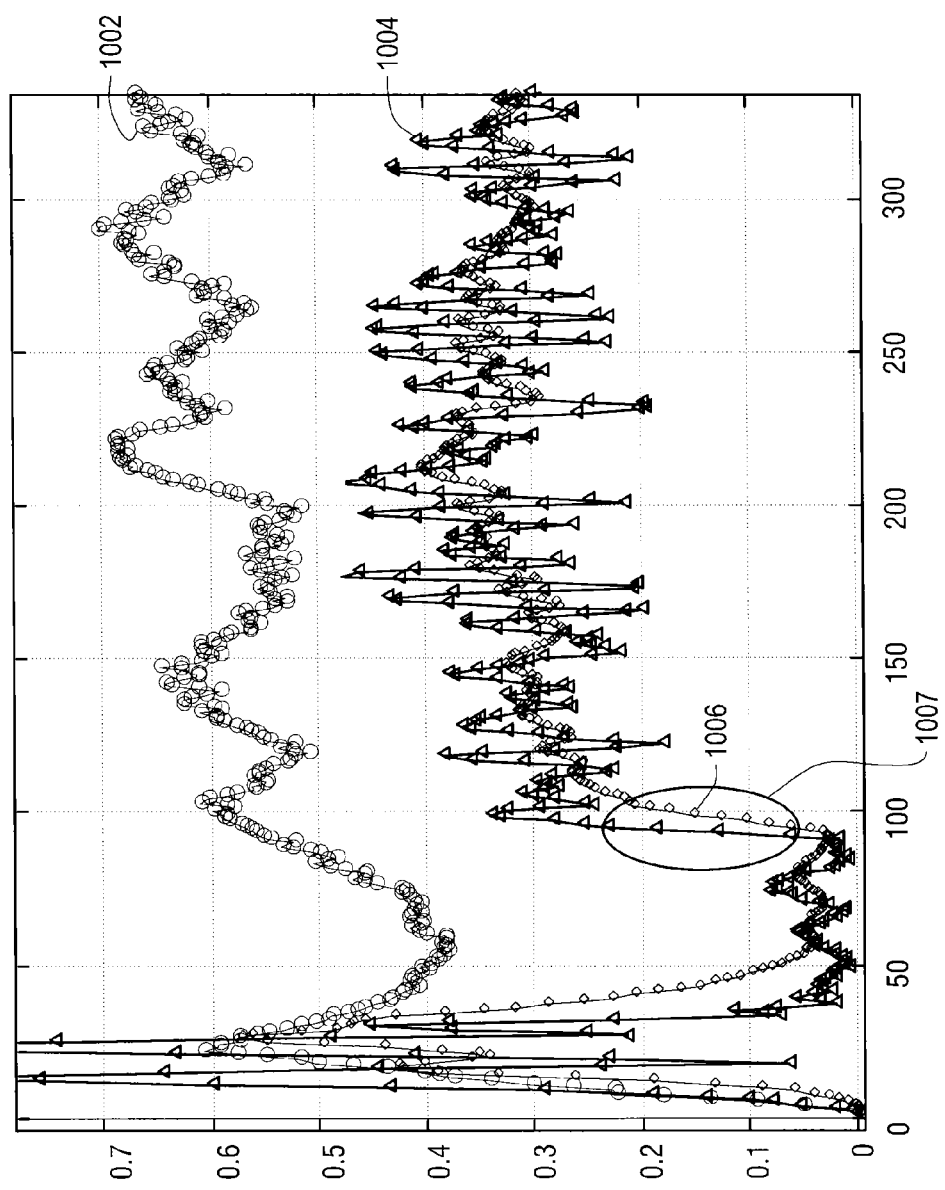
FIG. 10 shows plots associated with an example signal affected by an example of out-of-band distortion that may be detected and corrected by an example embodiment of the preamble detection and CFO acquisition module shown in FIG. 2 and FIG. 3.

FIG. 10 shows on a common axis, plot 1002 of example output generated by analog-to-digital converter 132, described above with respect to FIG. 1, plot 1004 of example output generated by channel filter 204, described above with respect to FIG. 2, and plot 1006, which is a filtered, or smoothed, version of plot 1004. Plots 1004 and 1006 are typical of the type of channel filter output that may be monitored by low-pass filter monitoring unit 310, as described above. The significant rise from a small value in the magnitude of the channel filter output, shown at 107, is representative of a significant rise that, upon being detected by low-pass filter monitoring unit 310 maybe reported as indicating of the arrival of a true signal in the presence of out-of-band interference, as described above with respect to FIG. 6.

Figure 11:
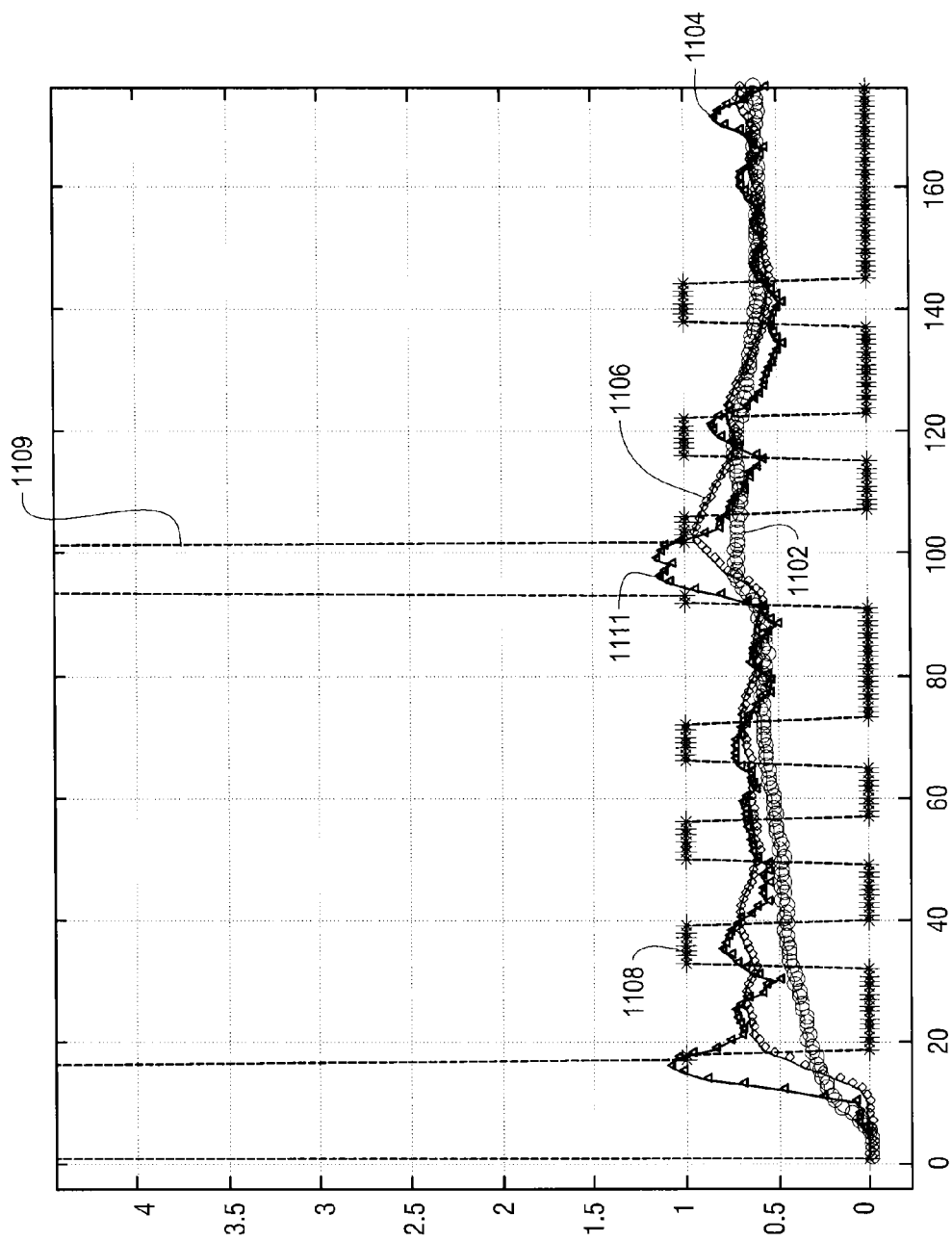
FIG. 11 shows plots associated with an example signal affected by an example of in-band distortion that may be detected and corrected for by an example embodiment of the preamble detection and CFO acquisition module shown in FIG. 2 and FIG. 3.

FIG. 11 shows on a common axis, plot 1102 of example output values generated by analog-to-digital converter 132, described above with respect to FIG. 1, plot 1104 of example output values generated by channel filter 204, described above with respect to FIG. 2, plot 1106, which is a filtered, or smoothed, version of plot 1104, and plot 1108 which is a plot of the RSSI values generated by RSSI module 134, described above with respect to FIG. 1. Plots 1104 and 1108 are typical of the type of channel filter output and RSSI module output that may be monitored by low-pass filter monitoring unit 310 and RSSI monitoring unit 312, respectively, as described above. The large rise from a small value in the magnitude of the channel filter output, shown at 1111, occurs concurrently with a significant change in the RSSI values, shown at 1109. Such concurrent changes in the respective output values, upon being detected by low-pass filter monitoring unit 310 and RSSI monitoring unit 312, respectively, and reported to preamble detection and CFO acquisition module controller 302 may be interpreted as indicating the presence of in-band interference, as described above with respect to FIG. 6.

It is to be understood that various functions of the described robust differential receiver for a frequency modulated system is compatible with and may be seamlessly integrated within integrated circuit hardware, such as system on a chip (SoC) devices. Further, it is to be understood that the described approach may be distributed in any manner among any quantity (e.g., one or more) of hardware and/or software modules or units that may be interconnected with circuitry and/or software interfaces.

For purposes of explanation, in the above description, numerous specific details are set forth in order to provide a thorough understanding of the robust differential receiver for a frequency modulated system. It will be apparent, however, to one skilled in the art that the robust differential receiver for a frequency modulated system may be practiced without these specific details. In other instances, well-known structures and devices are shown in block diagram form in order to avoid obscuring the features of the robust differential receiver for a frequency modulated system and the RF transmitter/receiver devices in which the robust differential receiver for a frequency modulated system may be used.

While the robust differential receiver for a frequency modulated system has been described in conjunction with the specific embodiments thereof, it is evident that many alternatives, modifications, and variations will be apparent to those skilled in the art. Accordingly, embodiments of the robust differential receiver for a frequency modulated system as set forth herein are intended to be illustrative, not limiting. There are changes that may be made without departing from the spirit and scope of the invention.

What is claimed is:

1. A receiver, comprising:
   a detector configured to generate phase values based on a stream of baseband data that is provided to a received signal strength indicator (RSSI) module; and a preamble detection module, comprising:
- a monitor configured to monitor the phase values and detect an ambiguity in the phase values;
- an eliminator configured to remove the detected ambiguity to produce corrected phase values;
- a preamble detector configured to detect a communication channel preamble sequence based on the corrected phase values; and
- a received signal strength indicator (RSSI) monitor configured to monitor an output of the RSSI module and report changes in a magnitude of RSSI values generated by the RSSI module to a controller configured to determine whether in-band interference is present in the detected communication channel preamble sequence based on changes in a magnitude of data filtered by a filter.

2. The receiver of claim 1, further comprising:
the filter configured to filter data outside of a predetermined frequency range,
wherein the preamble detector further comprises:
- a filter monitor configured to monitor an output generated by the filter and report changes in a magnitude of the filter output; and
- the controller to determine whether out-of-band interference is present in the detected communication channel preamble sequence based on reported changes received from the filter monitor.

3. The receiver of claim 2,
wherein the controller determines whether in-band interference is present in the detected communication channel preamble sequence based on reported changes received from both the filter monitor and the RSSI monitor.

4. The receiver of claim 1, further comprising:
an offset module configured to determine a carrier frequency offset for the stream of baseband data based on the phase values associated with the detected communication channel preamble sequence; and
an offset compensation module configured to compensate the stream of baseband data based on the determined carrier frequency offset.

5. The receiver of claim 4, further comprising:
a timing module configured to generate timing data based on the corrected phase values,
wherein the timing module receives the corrected phase values from one of the detector and an adder.

6. The receiver of claim 5, wherein:
a source of the corrected phase values to the timing module is controlled by a multiplexor.

7. The receiver of claim 1, further comprising:
a data detection module configured to generate a demodulated data stream based on the corrected phase values received from the detector.

8. The receiver of claim 1, further comprising:
a differential detector configured to generate a variation of a frequency for a predetermined duration based on the stream of baseband data.

9. A method for a receiver, the method comprising:
generating phase values based on a stream of baseband data;
detecting an ambiguity in the phase values;
correcting the detected ambiguity to produce corrected phase values;
detecting a communication channel preamble sequence based on the corrected phase values;
monitoring an output of a received signal strength indicator (RSSI) module configured to receive the stream of baseband data;
detecting changes in a magnitude of RSSI values generated by the RSSI module;
reporting the changes to a controller; and
determining by the controller whether in-band interference is present in the communication channel preamble sequence based on changes in a magnitude of a filtered baseband data.

10. The method of claim 9, further comprising:
filtering data outside of a predetermined frequency range from the stream of baseband data to produce the filtered baseband data;
monitoring the filtered baseband data to detect changes in a magnitude of the filtered baseband data; and
determining whether out-of-band interference is present in a set of preamble phase values based on the detected changes in the magnitude of the filtered baseband data.

11. The method of claim 10, further comprising:
determining whether in-band interference is present in the set of preamble phase values based on the detected changes in the magnitude of RSSI values.

12. The method of claim 9, further comprising:
determining a carrier frequency offset for the stream of baseband data based on the phase values associated with the detected communication channel preamble sequence; and
compensating the stream of baseband data based on the determined carrier frequency offset.

13. The method of claim 9, further comprising:
generating a demodulated data stream based on the corrected phase values received from a phase detector.

14. A radio frequency (RF) receiver comprising:
a detector configured to generate phase values based on a stream of baseband data; and
a preamble detection module, comprising:
- a monitor configured to monitor the phase values and detect an ambiguity in the phase values;
- an eliminator configured to remove the detected ambiguity to produce corrected phase values;
- a preamble detector configured to detect a communication channel preamble sequence based on the corrected phase values; and
- a received signal strength indicator (RSSI) monitor configured to monitor an output of a received signal strength indicator (RSSI) module that receives the stream of baseband data and report changes in a magnitude of RSSI values generated by the RSSI module to a controller configured to determine whether in-band interference is present in the detected communication channel preamble sequence based on changes in a magnitude of data filtered by a channel filter.

15. The RF receiver of claim 14, further comprising:
the filter configured to filter data outside of a predetermined frequency range,
wherein the preamble detector further comprises:
- a filter monitor configured to monitor an output generated by the filter and report changes in a magnitude of the filter output; and
- the controller configured to determine whether out-of-band interference is present in the detected communication channel preamble sequence based on reported changes received from the filter monitor.

16. The RF receiver of claim 15, wherein the controller determines whether in-band interference is present in the detected communication channel preamble sequence based on reported changes received from both the filter monitor and the RSSI monitor.

17. The RF receiver of claim 14, further comprising:
an offset module configured to determine a carrier frequency offset for the stream of baseband data based on phase values associated with the detected communication channel preamble sequence; and
an offset compensation module configured to compensate the stream of baseband data based on the determined carrier frequency offset.

18. The RE receiver of claim 17, further comprising:
a timing module configured to generate timing data based on the corrected phase values, wherein the timing module receives the corrected phase values from one of the detector and an adder.

19. The RF receiver of claim 14, further comprising:
a data detection module configured to generate a demodulated data stream based on the corrected phase values received from the detector.

20. The RE receiver of claim 14, further comprising:
a differential detector configured to generate a variation of the frequency for a predetermined duration based on the stream of baseband data.

\* \* \* \* \*